(12) United States Patent
Kroeckel

(10) Patent No.: US 7,663,370 B2
(45) Date of Patent: Feb. 16, 2010

(54) ARRANGEMENT TO CONTROL ANTENNA ELEMENTS

(75) Inventor: Horst Kroeckel, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/128,765

(22) Filed: May 29, 2008

(65) Prior Publication Data

US 2008/0297155 A1 Dec. 4, 2008

(30) Foreign Application Priority Data

May 29, 2007 (DE) .................. 10 2007 024 824

(51) Int. Cl.
*G01V 3/00* (2006.01)
(52) U.S. Cl. ..................... 324/322; 324/318
(58) Field of Classification Search .............. 324/322, 324/318

See application file for complete search history.

(56) References Cited

U.S. PATENT DOCUMENTS

| | | | |
|---|---|---|---|
| 6,750,652 B2 * | 6/2004 | Weyers et al. | 324/318 |
| 6,982,554 B2 * | 1/2006 | Kurpad et al. | 324/318 |
| 6,995,561 B2 * | 2/2006 | Boskamp et al. | 324/318 |
| 7,019,527 B2 * | 3/2006 | Kleihorst et al. | 324/322 |

FOREIGN PATENT DOCUMENTS

WO   WO 2007/124246   11/2007

* cited by examiner

*Primary Examiner*—Louis M Arana
(74) *Attorney, Agent, or Firm*—Schiff Hardin LLP

(57) ABSTRACT

An arrangement to control an antenna arrangement in a magnetic resonance examination representatively has a device for signal splitting. This device has an input and a first input and a second output. A radio-frequency transmission signal is supplied at the input. The device for signal splitting has phase-shaping components with which the transmission signal supplied via the input is divided into a first transmission signal for the first output and a second transmission signal for the second output. A phase difference between the first transmission signal and the second transmission signal can be adjusted by the phase-shaping components. An antenna arrangement is provided that has a first and second connections and that is fashioned to radiate a circularly-polarized transmission signal as soon as the two transmission signals with a phase difference of 90° are present at both connections. Each output of the device for signal splitting is connected with an associated connection of the antenna arrangement. The device for signal splitting has switchable components with which selected ones of the phase-shaping components can be activated or deactivated in order to alter the phase difference.

8 Claims, 4 Drawing Sheets

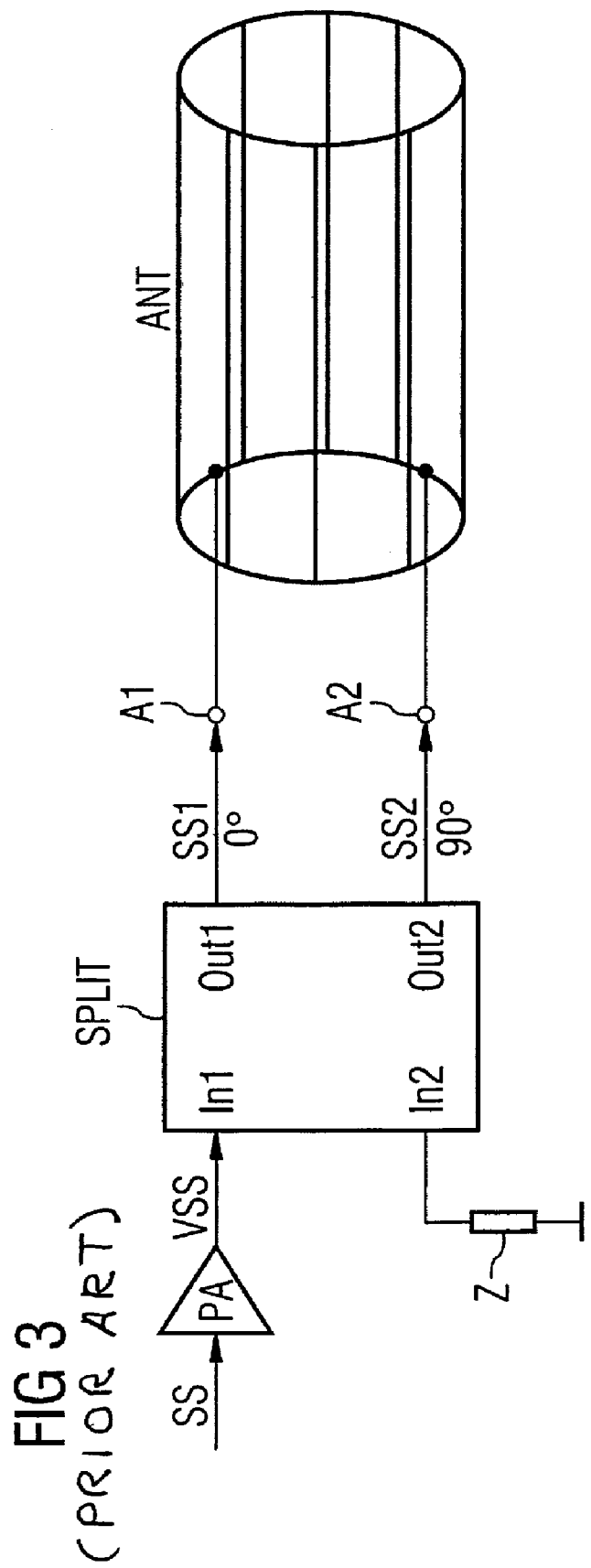

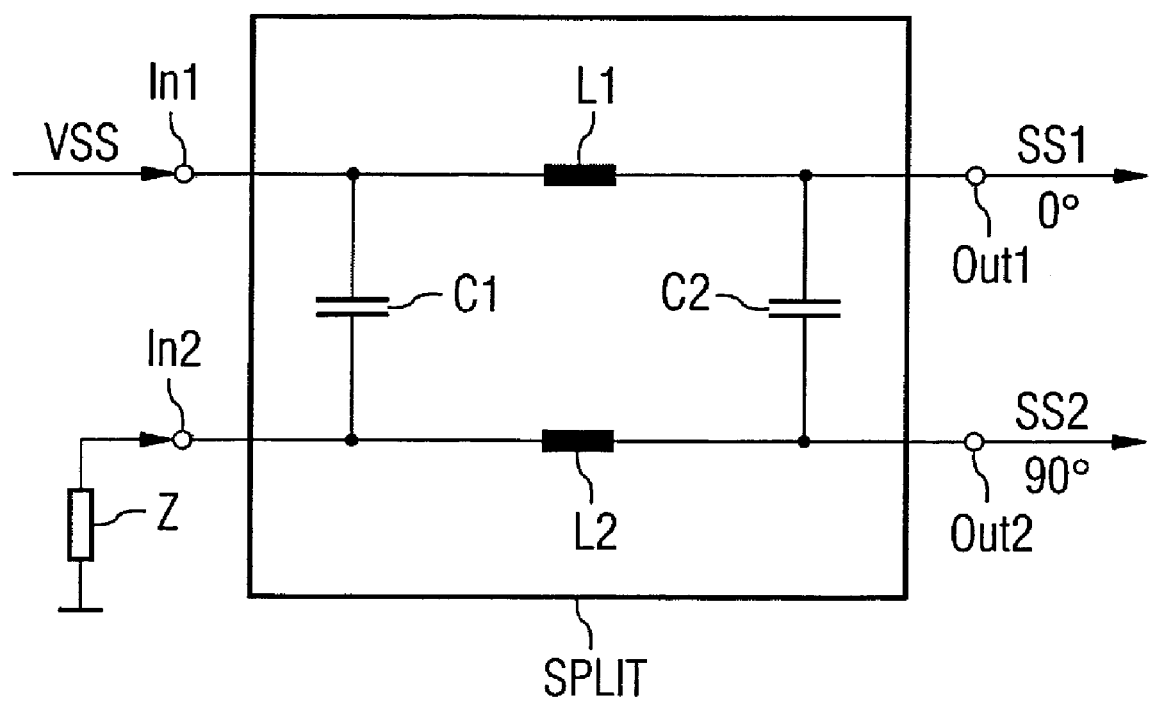

ARRANGEMENT TO CONTROL ANTENNA ELEMENTS

BACKGROUND OF THE INVENTION

1. Field of the Invention

The present invention concerns an arrangement to control an antenna arrangement as well as a device for signal splitting and a transmission method, for a magnetic resonance examination to be implemented.

2. Description of the Prior Art

Presently techniques known as "transmit-sense" techniques are under discussion for use in magnetic resonance examinations of patients in order to excite nuclear spins in a narrowly limited range in a targeted manner.

This technique enables the effective integral of the radio-frequency magnetic field for examination to be directed only in a narrowly limited region of interest for the excitation of the nuclear spins, while also enabling the integral of the radio-frequency magnetic field (which integral is effective for the excitation of the nuclear spins) to be homogeneously adjusted in the examination region.

Multiple transmitters are used in this technique, each of which is connected with an antenna element of a transmission antenna arrangement. For example, the transmission antenna arrangement is fashioned in the form of a birdcage antenna. A radio-frequency signal is emitted via each transmission element in a transmission time period. In their time curve, the radio-frequency signals differ entirely from one another in terms of their voltages, frequencies and phases.

Today circularly-polarized transmission signals are preferably used for examination.

FIG. 3 shows an exemplary arrangement of a circularly-polarized transmission signal according to the prior art.

A radio-frequency transmission signal SS arrives at a radio-frequency splitter SPLIT as an amplified transmission signal VSS via a transmission power amplifier PA. The radio-frequency splitter SPLIT has two inputs In1, IN2 as well as two outputs Out1, Out2, wherein the amplified transmission signal VSS is connected to a first input In1.

The radio-frequency splitter SPLIT divides the transmission signal VSS in two, into essentially equal transmission signals SS1 and SS2, with the two transmission signals SS1 and SS2 being phase-shifted relative to one another by 90°.

A first transmission signal SS1 arrives at a first connection A1 of an antenna arrangement ANT while a second transmission signal SS2 arrives at a second connection A1 of the antenna arrangement ANT. The two connections A1, A2 form respective feed points of the antenna arrangement ANT.

The antenna arrangement ANT is fashioned to radiate a circularly-polarized transmission signal when two transmission signals (ideally phase-shifted by 90°) are fed to it via the feed points.

In this example the antenna arrangement ANT is fashioned as what is known as a birdcage resonator. The two connections A1 and A2 are arranged offset on a ferrule of the antenna ANT such that a circularly-polarized transmission signal is radiated by the transmission signals phase-shifted by 90°.

FIG. 4 shows an exemplary embodiment according to the prior art, based on FIG. 3 of the radio-frequency splitter SPLIT.

The radio-frequency splitter SPLIT has a first input In1, a second input In2, a first output Out1 and a second output Out2. The amplified transmission signal VSS is connected at the first input In1.

The first input In1 is connected via a first inductor L1 with the first output Out1 while the second input In2 is connected via a second inductor L2 with the second output Out2. It is also possible to magnetically couple the inductors L1, L2.

The first input In1 is connected via a first capacitor C1 with the second input In2 while the first output Out1 is connected via a second capacitor C2 with the second output Out2.

The second input In2 is connected via a resistor Z with a reference potential (here the ground) such that constant power components reflected in the outputs Out1, Out2 are compensated in the resistor Z.

The first output Out1 is connected with the first connection A1 of the antenna arrangement ANT while the second output Out2 is connected with a second connection A2 of the antenna arrangement ANT.

The values of the inductors L1, L2, the coil coupling and the values of the capacitors C1, C2 are selected such that the desired phase difference of 90° between the two transmission signals SS1 and SS2 results at the outputs Out1, Out2 of the frequency splitter SPLIT.

Here the first transmission signal SS1 that is fed via the first output Out1 to the first connection A1 as a first feed point at the ferrule of the antenna ANT has a phase position of 90°.

The circularly-polarized transmission signal is formed by the phase-shifted control at the aforementioned connections A1, A2.

In magnetic resonance apparatuses that are operated with magnetic field strengths of greater than or equal to three Tesla and that use circularly-polarized transmission signals, currents are induced in the tissue of the subject due to different relative permittivities (dielectric constants) and conductivities of the human tissue.

Depending on the type of the tissue and after distribution of the currents, these currents cause an amplification or reduction of the exciting radio-frequency magnetic field. These effects disadvantageously affect the examination.

SUMMARY OF THE INVENTION

An object of the present invention to provide an improvement in examination results with low effort in magnetic resonance apparatuses of the aforementioned type.

The above object is achieved in accordance with the present invention by an arrangement to control an antenna arrangement in a magnetic resonance examination that has a device for signal splitting, which has an input and first and second outputs. A radio-frequency transmission channel is supplied at the input of the device for signal splitting, which contains phase-shaping components with which the transmission signal supplied at the input is divided into a first transmission signal at the first output and a second transmission signal at the second output. The first and second transmission signals have a phase difference therebetween that is adjusted by the phase-shaping components, by virtue of these components being switchable so as to be respectively activated or deactivated in order to modify the phase difference. The antenna arrangement has first and second connections for the first and second transmission signals, respectively, and is configured to radiate a circularly-polarized field as soon as the two transmission signals at the respective connections exhibit a phase difference of 90°.

Not only is a circularly-polarized transmission signal used for examination in the present invention; rather, examination results are acquired via time-shifted usage of further linearly-polarized or anti-circularly-polarized transmission signals.

An improvement in the examination results is achieved via superimposition of the individual examination results or via the superimposition of the partial images acquired in the respective examination.

A device for signal splitting is used in the inventive arrangement to control antenna elements of a transmission antenna arrangement in a magnetic resonance apparatus. This device for signal splitting has an input and at least one first and one second output, wherein a radio-frequency transmission signal is connected at the input.

The first output of the device for signal splitting is connected with a first connection of an antenna arrangement and the second output of the device for signal splitting is connected with a second output of the antenna arrangement. The antenna arrangement is fashioned for radiation of a circularly-polarized transmission signal as soon as transmission signals that possess a phase difference of 90° relative to one another are present at the two connections of the antenna arrangement.

The device for signal splitting has phase-shaping components with which the transmission signal supplied via the input is divided into a first transmission signal and a second transmission signal. A first transmission signal formed in this manner arrives at the first connection of the antenna arrangement via the first output of the device for signal splitting while a second transmission signal so formed arrives at the second connection of the antenna arrangement via the second output of the device for signal splitting.

A difference between the phase position of the first transmission signal and that of the second transmission signal can be achieved via the phase-shaping components of the device for signal splitting, such that a circularly-polarized sum emission field is formed by radiation from the antenna arrangement.

In addition to the phase-shaping components, the device for signal splitting has additional switchable components. These are arranged such that the phase-shaping components can be activated and deactivated. The phase position of the two signals that are present at the outputs of the device for signal splitting is altered by the activation or deactivation of the phase-shaping components, such that a linearly-polarized transmission signal or an anti-circularly-polarized transmission signal is formed by radiating via the antenna arrangement.

BRIEF DESCRIPTION OF THE DRAWINGS

FIG. 3 shows the exemplary arrangement described above to form a circularly-polarized transmission signal according to the prior art.

FIG. 4 shows the exemplary embodiment of the radio-frequency splitter SPLIT according to the prior art that is described above and based on FIG. 3.

DESCRIPTION OF THE PREFERRED EMBODIMENTS

Figure 1:
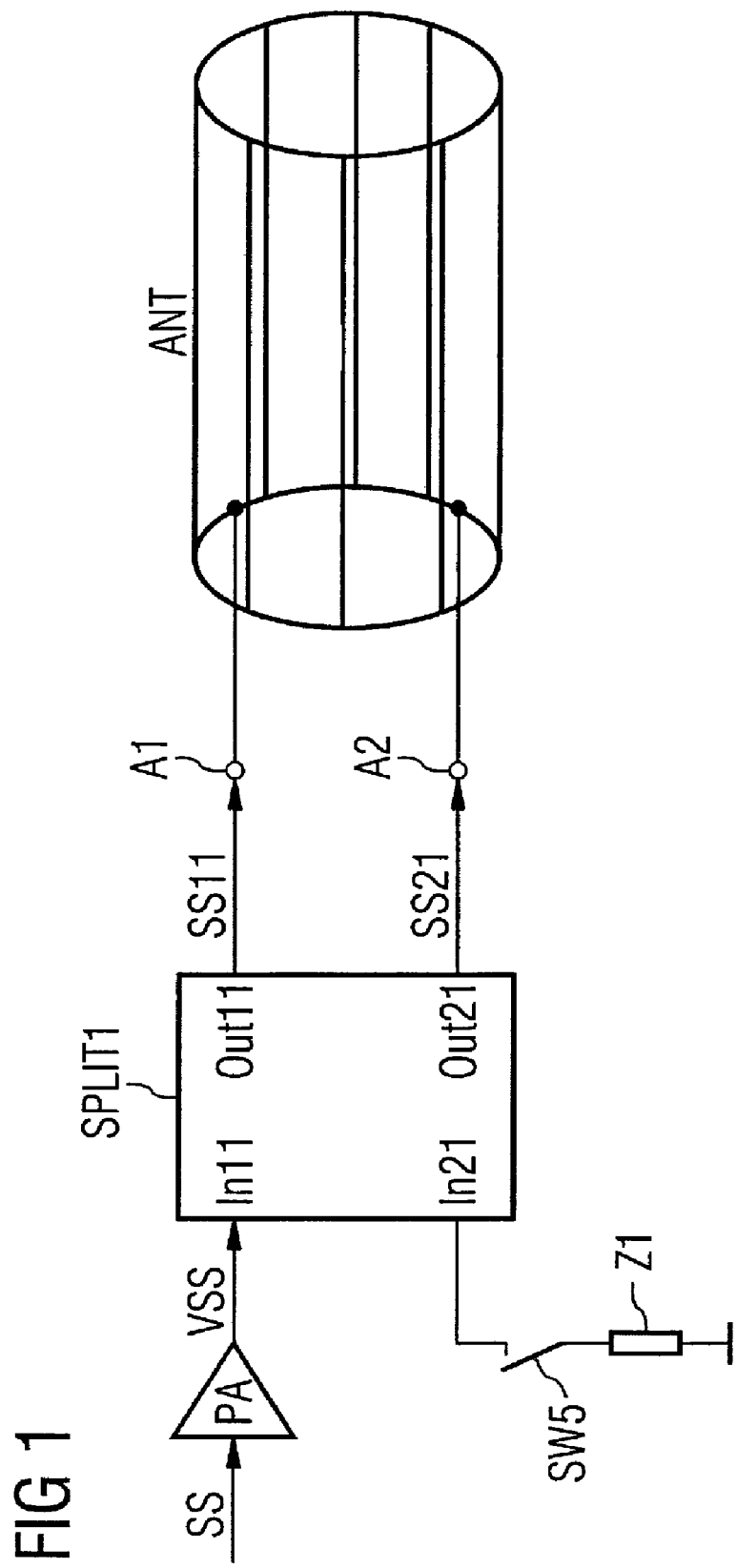
FIG. 1 illustrates an embodiment of an arrangement according to the invention to form a circularly-polarized transmission signal.

FIG. 1 shows an embodiment of an inventive arrangement to form a circularly-polarized transmission signal.

A radio-frequency transmission signal SS arrives as an amplified transmission signal at a radio-frequency splitter SPLIT1 via a transmission power amplifier PA.

The radio-frequency splitter SPLIT1 has two inputs In11, IN21 as well as two outputs Out11, Out21, wherein the amplified transmission signal VSS is connected at a first input In11.

The radio-frequency splitter SPLIT11 divides the transmission signal VSS into two essentially identical transmission signals SS11 and SS21, wherein the two transmission signals SS11 and SS21 are preferably phase-shifted by 90° relative to one another.

As an alternative to this, the radio-frequency splitter SPLIT1 alternatively divides the transmission signal VSS into two essentially identical transmission signals SS11 and SS21, with the two transmission signals SS11 and SS21 exhibiting further phase differences or no phase difference relative to one another.

A first transmission signal SS11 arrives at a first connection A1 of an antenna arrangement ANT while a second transmission signal SS21 arrives at a second connection A1 of the antenna arrangement ANT. The two connections A1, A2 form respective feed points of the antenna arrangement ANT.

The antenna arrangement ANT is fashioned to radiate a circularly-polarized field when two transmission signals (ideally phase-shifted by 90°) are fed to it via the feed points.

In this example the antenna arrangement ANT is thus fashioned as a birdcage resonator. The two connections A1 and A2 are arranged on a ferrule of the antenna ANT such that a circularly-polarized transmission signal is formed upon irradiation via the transmission signals SS11 and SS21 phase-shifted by 90°.

If the two transmission signals SS11 and SS21 now exhibit a phase shift deviating by 90° from one another, a linearly-polarized or an anti-circularly-polarized field is formed upon the irradiation.

Figure 2:
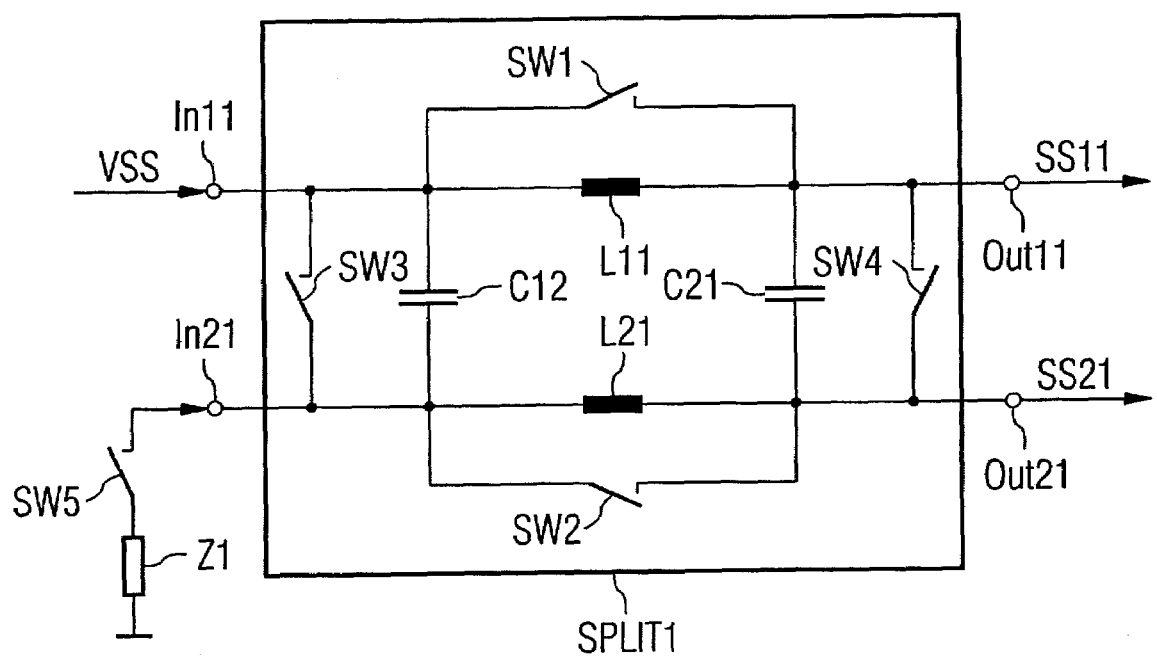
FIG. 2 illustrates an embodiment of the inventive device for signal splitting, based on FIG. 1.

FIG. 2 shows an embodiment of the inventive device for signal splitting SPLIT1 according to the invention, based on FIG. 1.

The radio-frequency splitter SPLIT 1 has a first input In11, a second input In21, a first output Out11 and a second output Out21. The amplified transmission signal VSS1 is connected at the first input In11.

The first input In11 is connected via a first inductor L11 with the first output Out11 while the second input In21 is connected via a second inductor L21 with the second output Out21. It is also possible to magnetically couple the inductors L11, L21.

The first input In11 is connected via a first capacitor C12 with the second input In21 while the first output Out11 is connected via a second capacitor C21 with the second output Out21.

The second input In21 is connected via a switch SW5 and via a first resistor Z with a reference potential (here ground), such that constant power components reflected at the outputs Out11, Out21 are compensated in the resistor Z.

The first output Out11 is connected with the first connection A1 (not shown here) of the antenna arrangement ANT while the second output Out2l is connected with the second connection A2 (not shown here) of the antenna arrangement ANT.

The inductors L11 and L21 as well as the capacitors C12 and C21 serve to divide the supplied transmission signal VSS that is present at the input In11 of the device for signal splitting SPLIT1 into a first transmission signal SS11 and a second transmission signal SS21.

The first transmission signal SS11 arrives via the first output Out11 of the device for signal splitting SPLIT1 at the first connection A1 (not shown here) of the antenna arrangement ANT. The second transmission signal SS21 arrives via the second output Out21 of the device for signal splitting SPLIT1 at the second connection A2 (not shown here) of the antenna arrangement ANT.

The two transmission signals SS11 and SS22 are essentially identical, but exhibit a phase difference relative to one another. The phase difference is set by the inductors L11 and L21 and the capacitors C12 and C21 as phase-shaping components.

According to the invention, additional switchable components SW1 through SW5 are provided in the device for signal splitting SPLIT1 with which the phase-shaping components L11, L21, C12 and C21 can be activated or deactivated.

The phase difference between the two transmission signals SS11 and SS21 provided for the antenna arrangement ANT is altered by the activated or deactivated phase-shaping components L11, L21, C12 and C21. The goal is to vary the phase difference of the two transmission signals SS11 and SS21 such that a circularly-polarized field or an anti-circularly-polarized field or a linearly-polarized field is alternately formed by radiation from the antenna arrangement ANT.

For this purpose a first switch SW1 is connected to the first inductor L11 and a second switch SW2 is connected in parallel to the second inductor L21. A third switch SW3 is likewise connected to the first capacitor C12 and a fourth switch SW4 is connected in parallel to the second capacitor C21.

If the switchable components SW1 through SW4 are open, the values of the inductors L11 and L21, the coil coupling and the values of the capacitors C12 and C21 are selected such that a desired phase difference of 90° results between the two transmission signals SS11 and SS21 at the two outputs Out11 and Out21 of the frequency splitter SPLIT1. The circularly-polarized transmission signal is formed upon irradiation via the activation of the antenna arrangement ANT with a 90° phase shift of the two transmission signals SS11 and SS21.

The following polarizations of a transmission signal radiated via the antenna arrangement are achieved by the selectively occurring opening or closing of the switches SW1 through SW5:

| SW1 | SW2 | SW3 | SW4 | SW5 | Phase difference SS11 <=> SS21 | Polarization |
| --- | --- | --- | --- | --- | --- | --- |
| open | open | open | open | closed | 90° | circular |
| closed | closed | closed | closed | open | 0° | linear |

A switching from a circularly-polarized mode to a linearly-polarized mode is shown in this exemplary embodiment.

With correspondingly designed phase-shaping and switchable components as well as their circuiting it is also possible to form an anti-circular mode and, in addition to the linear mode shown here, a linear mode that is perpendicular to the shown linear mode.

The switches SW1 through SW5 are preferably fashioned as PIN diodes.

In summary, different polarized fields are used for magnetic resonance examinations. For example, a linearly-polarized field is used in a first time segment, a circularly-polarized field is used in a following second time segment and a further linearly-polarized field is used in a further following third time segment.

Each of these fields excites other currents in the body, such that a respective different examination result is acquired in each time segment.

These evaluation results are subjected to an additional evaluation individually and/or in an overlapping manner. For example, cancellations of the radio-frequency magnetic field in respective partial images may be present, but at respectively different geometric points. These cancellations can be reduced by the superimposition of the partial images. An improved sum image is formed by the superimposition of the individual partial images.

Although modifications and changes may be suggested by those skilled in the art, it is the intention of the inventor to embody within the patent warranted hereon all changes and modifications as reasonably and properly come within the scope of his contribution to the art.

I claim as my invention:

1. A control arrangement for operating an antenna in a magnetic resonance examination, comprising:

a signal splitting device comprising an input supplied with a radio-frequency input transmission channel, a first output, and a second output;

said signal splitting device comprising a plurality of phase-shaping components that act on said input transmission signal to divide said input transmission signal to into a first transmission signal at said first output and a second transmission signal at said second output;

said signal splitting device comprising a plurality of switchable components, with each of said phase-shaping components having one of said switchable components connected in parallel therewith, said switchable components being individually operable to respectively activate or deactivate the one of said phase-shaping components in parallel therewith to set a phase difference between said first transmission signal and said second transmission signal; and an antenna arrangement comprising first and second connections respectively connected to said first and second outputs of said signal splitting device, said antenna arrangement being configured to radiate a circularly-polarized field as soon as the first and second transmission signals respectively at said first and second connections exhibit a phase difference therebetween of 90°.

2. A control arrangement as claimed in claim 1 wherein said antenna arrangement is configured as a birdcage resonator.

3. A control arrangement as claimed in claim 1 wherein said signal splitting device comprises first and second inductors and first and second capacitors as said phase-shaping components.

4. A control arrangement as claimed in claim 3 wherein said input to said signal splitting device is a first input, and wherein said signal splitting device comprises a second input supplied with a reference potential via at least one input component selected from the group consisting of switches and resistors.

5. A control arrangement as claimed in claim 4 wherein said signal splitting device comprises first and second inductors and first and second capacitors as said phrase-shaping components, and wherein said first input is connected to said first output via said first inductor, said first input is connected to said second input via said first capacitor, said first output is connected with said second input via said second capacitor, and said second input is connected with said second output via said second inductor.

6. A signal splitting device that participates in control of an antenna arrangement in a magnetic resonance examination, comprising:

an input supplied with a radio-frequency input transmission channel, a first output, and a second output, said first and second outputs being configured for connection to an antenna arrangement of a magnetic resonance apparatus;

a plurality of phase-shaping components that act on said input transmission signal to divide said input transmission signal into a first transmission signal at said first output and a second transmission signal at said second output; and each of said phase-shaping components having a switchable component connected in parallel therewith that is operable to respectively activate or deactivate the phase-shaping component in parallel therewith, the respective switchable components being individually operable to activate or deactivate selected ones of said phase-shaping components to set a phase difference between said first transmission signal and said second transmission signal.

7. A transmission method for supplying signals to an antenna arrangement for conducting a magnetic resonance examination, comprising the steps of:

using a plurality of phase-shaping components splitting a radio-frequency input transmission signal into a first transmission signal and a second transmission signal exhibiting a phase difference relative to each other;

connecting each of said phase-shaping components individually in parallel with a switchable component;

supplying said first transmission signal and said second transmission signal to an antenna arrangement;

radiating a circularly-polarized field from said antenna arrangement as soon as said first and second transmission signals exhibit a phase difference of 90° therebetween;

obtaining a magnetic resonance examination result using the circularly-polarized field; and modifying said phase difference to set respective other phase differences, other than 90°, between said first and second transmission signals, and operating said antenna arrangement to emit polarized fields, other than said circularly-polarized field, with said first and second transmission signals with said other polarizations, respectively, to obtain further, different magnetic resonance examination results, by individually operating said switchable components to selectively activate or deactivate the phase-shaping component in parallel therewith.

8. A method as claimed in claim 7 comprising superimposing said magnetic resonance examination result and said further magnetic resonance examination results to reduce radio-frequency field cancellations and excessive elevations of the respective fields contributing to an overall magnetic resonance examination result composed of said magnetic resonance examination result and said further magnetic resonance examination results.

* * * * *